United States Patent [19]

Hallford

[11] 4,380,831
[45] Apr. 19, 1983

[54] SYMMETRIC MICROWAVE MIXER WITH IMPROVED ISOLATION

[75] Inventor: Ben R. Hallford, Wylie, Tex.
[73] Assignee: Rockwell International Corporation, El Segundo, Calif.
[21] Appl. No.: 286,405
[22] Filed: Jul. 24, 1981
[51] Int. Cl.³ .......................... H04B 1/26; H03H 7/42
[52] U.S. Cl. .................................... 455/327; 333/26; 455/330
[58] Field of Search ................................ 455/325–327, 455/330, 331; 333/26

[56] References Cited

U.S. PATENT DOCUMENTS 3,678,433 7/1972 Hallford .
3,831,097 8/1974 Neuf .
4,186,352 1/1980 Hallford .............................. 333/26
4,240,052 12/1980 Hallford .

OTHER PUBLICATIONS

George L. Matthaei, et al., "Microwave Filters, Impedance-Matching Networks, and Coupling Structures", McGraw Hill, New York, 1964, pp. 809–812.
Julius Lange, "Interdigitated Strip-Line Quadrature Hybrid", *1969 International Microwave Symposium*, Dallas, Texas, May 5–7, IEEE Cat. No. 69 c 6, pp. 10–13.

*Primary Examiner*—Marc E. Bookbinder
*Attorney, Agent, or Firm*—Michael E. Taken; Bruce C. Lutz; Howard R. Greenberg

[57] ABSTRACT

Microwave circuit layout structure is disclosed for a diode quad mixer frequency converter with separate, isolated sections, each supplied by a respective half of dual balun port structure. The circuit layout structure is compact and symmetric, and enables coplanar diode connection.

11 Claims, 3 Drawing Figures

SYMMETRIC MICROWAVE MIXER WITH IMPROVED ISOLATION

TECHNICAL FIELD

The invention relates to microwave diode mixers and associated circuitry for up and down conversion between high frequency signals (e.g. RF or LO in the 6 GHz range) and low frequency signals (e.g. IF in the 70 MHz range), and more particularly to compact, symmetric circuit layout structure supplying the ports for a diode mixer with separate, isolated sections.

BACKGROUND AND SUMMARY

The present invention evolved from continuing development efforts pertaining to subject matter disclosed in my co-pending application Ser. No. 265,128 filed May 19, 1981, entitled "Symmetric Microwave Mixer". This co-pending application discloses a diode mixer with compact, symmetric conductor port structure significantly reducing unwanted sensitivity to adverse parameters.

The present invention relates to improvements in the microstrip circuit layout and structure for those applications where even greater isolation is desired. The mixer port structure of the present invention enables implementation of a four diode mixer with first and second separate, isolated sections. Each section comprises a pair of diodes interconnecting a respective half of a dual balun and a respective conductor.

In a particularly desirable aspect of the invention, mixer section separation and isolation is achieved without sacrificing compactness or symmetry of the mixer port structure. The mixer port structure of the present invention significantly reduces unwanted sensitivity to adverse parameters, and also overcomes problems of distortion caused by unequal conduction paths and diode lead lengths. Transmission lengths along the microwave conductors leading to the diode mixer sections are minimized to reduce loss and exposure to mismatch influences. Transmission path lengths through the diodes are also minimized, and are substantially equal to thus eliminate unwanted phase shift due to differential path lengths through the mixer diodes. The diode mixer leads are short and orthogonal, to provide good impedance matching and minimize unwanted coupling.

The microstrip circuit layout and structure further enables coplanar diode connection. This eliminates the need to extend diode leads through the substrate, and is desirable in applications where reduction of assembly costs has high priority.

The operating bandwidth of the mixer is significantly increased by the separate, isolated mixer sections, the balanced port structure, the equalized conduction path lengths, and the short lead lengths.

In another desirable aspect of the invention, standard printed circuit board techniques may be used for fabrication, resulting in cost effective manufacture. The invention also enables the use of low dielectric constant substrate material, further reducing cost.

DETAILED DESCRIPTION

Figure 1:
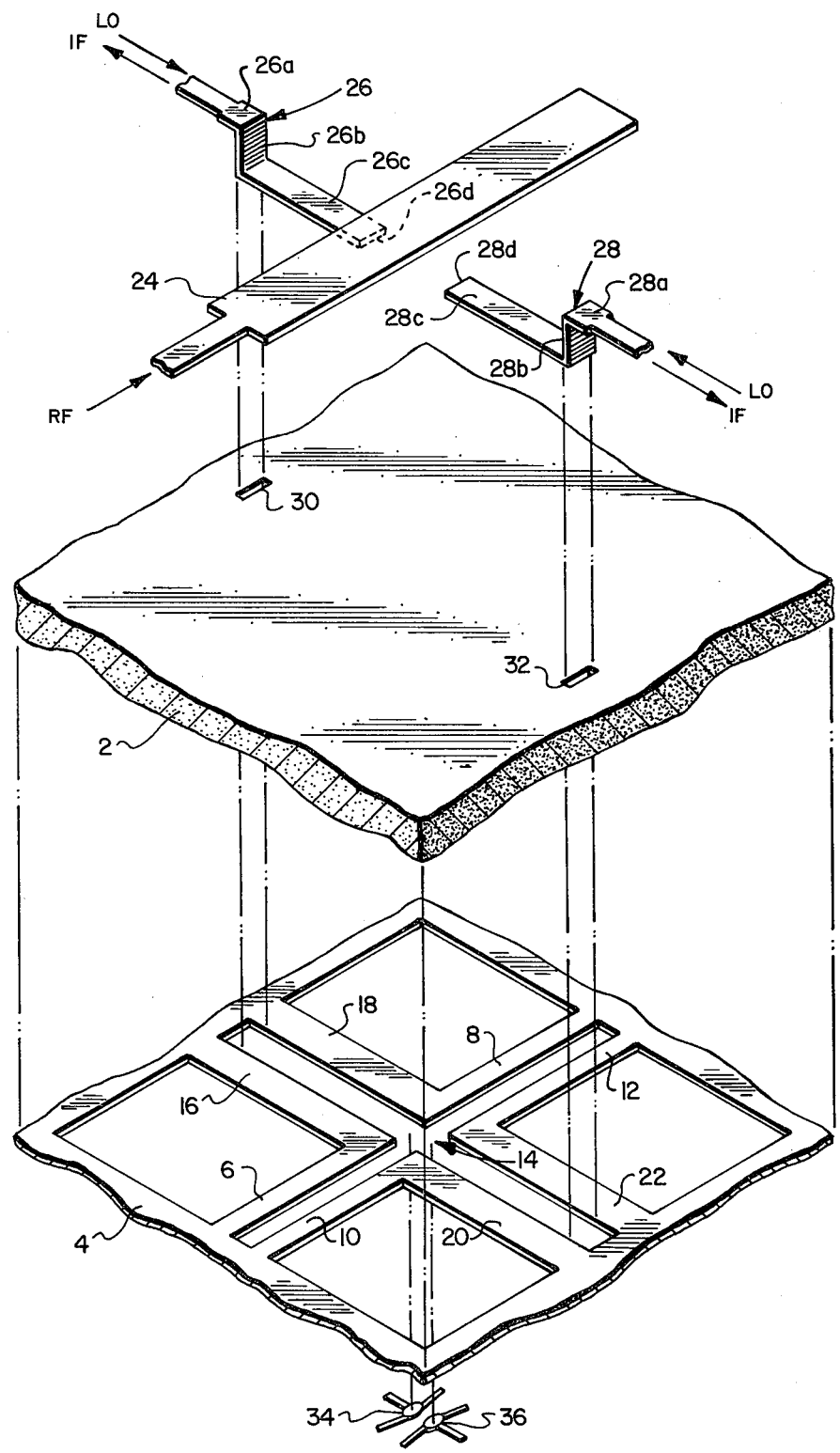
FIG. 1 is an exploded isometric view of microstrip circuit layout and structure constructed in accordance with the invention.
Figure 2:
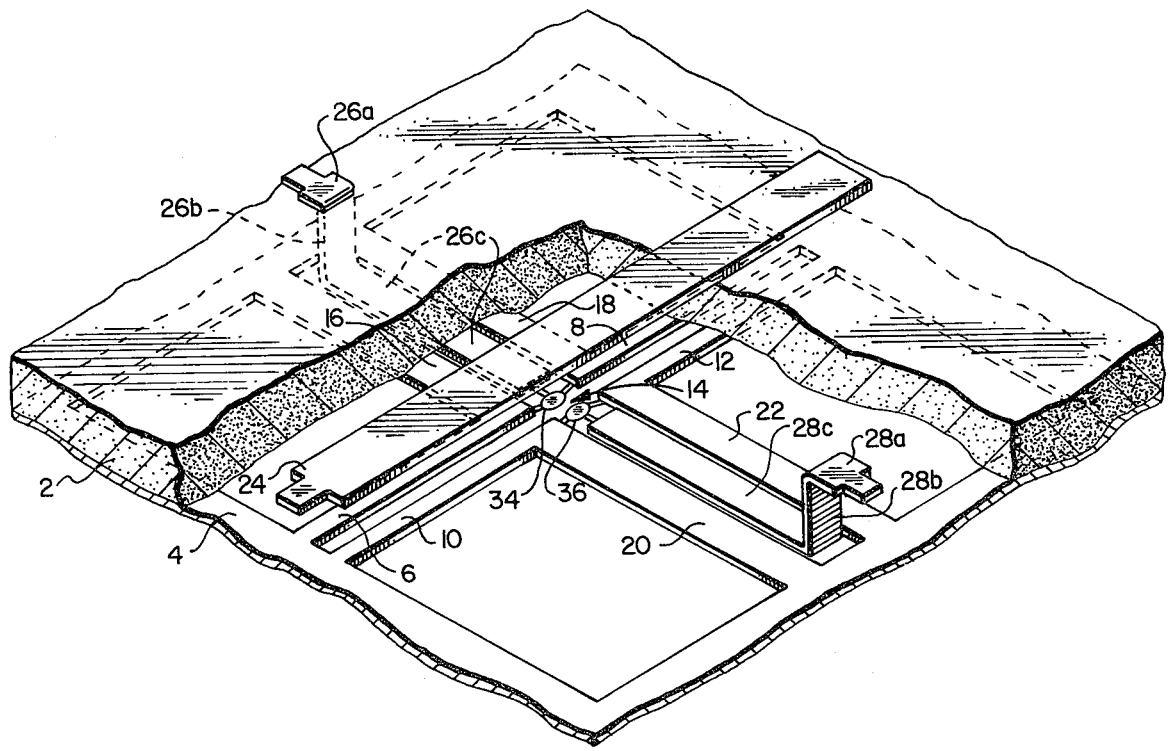
FIG. 2 is an assembly isometric view of the circuit layout and structure of FIG. 1.

FIGS. 1 and 2 show microstrip circuit layout structure constructed in accordance with the invention for a microwave mixer frequency converter. A planar dielectric substrate 2 has a ground plane 4 on the bottomside thereof. First and second pairs of secondary conductors 6 and 8, and 10 and 12, respectively, extend from ground plane 4 towards each other to a separation gap 14 therebetween. Each conductor has a stub diverging therefrom to ground plane 4. Stubs 16 and 18 extend from the first secondary conductor pair 6 and 8 to ground plane 4 in spaced parallel relation. Stubs 20 and 22 from the second secondary conductor pair 10 and 12 also extend in spaced parallel relation to ground plane 4 but oppositely from the first mentioned stubs 16 and 18. An RF transmission line 24 is on the topside of substrate 2 juxtaposed the first and second pairs of secondary conductors 6 and 8, and 10 and 12, for interacting therewith to dual balun couple a field balanced between the first secondary conductor pair 6 and 8 across gap 14, and a field balanced between the second secondary conductor pair 10 and 12 across gap 14.

Fifth and sixth conductors 26 and 28 have topside coplanar sections 26a and 28a on the topside of substrate 2, and have respective linking sections 26b and 28b, such as bus wire links or the like, extending down through substrate 2 to respective bottomside coplanar sections 26c and 28c. Linking sections 26b and 28b extend down through apertures 30 and 32 in the substrate. Bottomside sections 26c and 28c have spaced facing ends 26d and 28d proximate the facing ends of the first and second pairs of secondary conductors 6 and 8, and 10 and 12, and extend oppositely away therefrom, FIG. 2. Transmission line 24 extends in spaced parallel relation over the first and second pairs of secondary conductors 6 and 8, and 10 and 12, and is orthogonal to and coplanar with the topside sections 26a and 28a of the fifth and sixth conductors 26 and 28. The bottomside sections 26c and 28c of the fifth and sixth conductors are collinear and extend orthogonally to the first and second pairs of secondary conductors 6 and 8, and 10 and 12, and are separated by the same said first mentioned separation gap 14. Bottomside section 26c of the fifth conductor 26 extends in spaced parallel coplanar relation between said first two mentioned stubs 16 and 18. Bottomside section 28c of the sixth conductor 28 extends in spaced parallel coplanar relation between said second two mentioned stubs 20 and 22.

Figure 3:
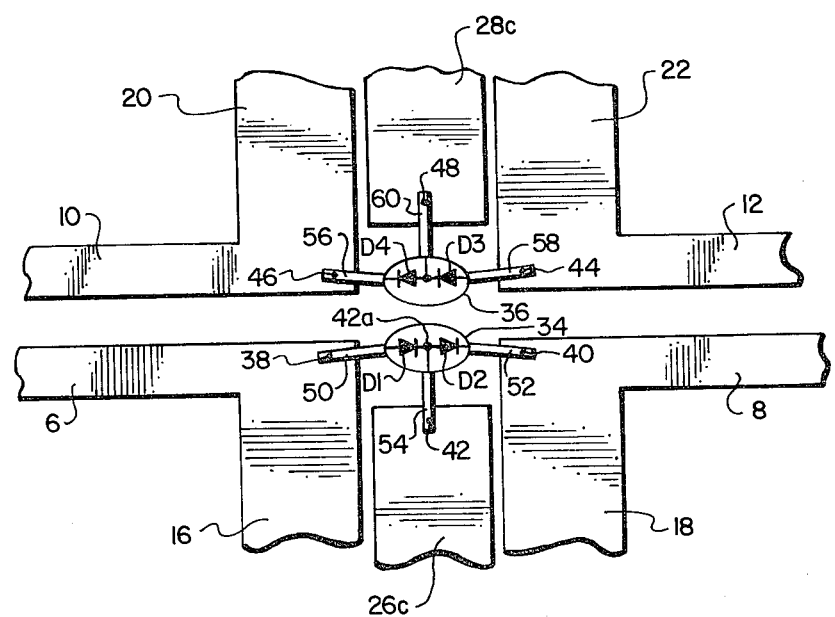
FIG. 3 is an enlarged plan view of the central portion of the bottomside of FIG. 2 as viewed from below, showing the diodes and their connections.

A diode mixer with first and second separate, isolated sections 34 and 36, FIGS. 1 and 2, is mounted on the bottomside of substrate 2. Referring to FIG. 3, the first section 34 comprises a first diode pair D1 and D2 interconnecting the first secondary conductor pair 6 and 8 and the bottomside section 26c of the fifth conductor 26 at coplanar connection points 38, 40 and 42 on the bottomside of substrate 2 for heterodyne modulation product signal generation. The second section 36 comprises a second diode pair D3 and D4 interconnecting the second secondary conductor pair 10 and 12 and the bottomside section 28c of the sixth conductor 28 at coplanar connection points 44, 46 and 48 on the bottomside of substrate 2 for heterodyne modulation product signal generation. The first diode pair D1 and D2 is connected in series between the first secondary conductor pair 6 and 8. The bottomside section 26c of the fifth conductor 26 is connected to a point between diodes D1 and D2. The second diode pair D3 and D4 is connected in series between the second secondary conductor pair 10 and 12. The bottomside section 28c of the sixth conductor 28 is connected to a point between diodes D3 and D4. First diode pair D1 and D2 has three coplanar leads 50, 52 and 54 which are substantially orthogonal and of substantially equal length. Second diode pair D3 and D4 has three coplanar leads 56, 58 and 60 which are substantially orthogonal and of substantially equal length.

When implemented as a down converter, an RF signal is input at port 24 and quadrature LO signals are input at ports 26a and 28a. The RF signal is dual balun coupled from transmission line 24 acting as a primary to first balanced secondary conductor pair 6 and 8 and to second balanced secondary conductor pair 10 and 12. A field thus exists across gap 14 between balanced conductors 6 and 8, and a field exists across gap 14 between balanced conductors 10 and 12. Conductors 6 and 8 provide a balanced input port to diode mixer section 34 at points 38 and 40. Conductors 10 and 12 provide a balanced input port to diode mixer section 36 at points 44 and 46. The LO signals from the input ports provided by the fifth and sixth conductors 26 and 28 are provided to the respective mixer sections at respective points 42 and 48.

The diode mixer sections 34 and 36 receive the RF and LO signals and output a plurality of frequencies, including an IF signal at a frequency which is the difference between the RF and LO signal frequencies. The frequencies which are output from a diode mixer are the modulation products which exist according to the heterodyne principle by which the mixer operates, as is known in the art, wherein an RF signal and an LO signal are applied to a nonlinear element, such as a diode. The RF and LO signals are mixed in the diodes to generate the various modulated frequencies, including IF signals on conductors 26 and 28. These IF signals may be passed through IF bandpass filters, for example as described in my U.S. Pat. No. 3,678,433, issued July 18, 1972, entitled "RF Rejection Filter". The outputs of such filters may, for example, be connected to a 90° quadrature 3 dB coupler, for example as shown in U.S. Pat. No. 3,831,097 to Neuf. The LO signals supplied to conductors 26 and 28 may be passed through IF rejection capacitors or filters, i.e., LO bandpass filters, such as shown in my U.S. Pat. No. 4,240,052, issued Dec. 16, 1980, entitled "Balun Filter Apparatus". These signals may also be passed through a branchline coupler, such as described in "Microwave Filter, Impedance-Matching Networks, and Coupling Structures", George L. Matthaei, et al., McGraw Hill, New York, 1964, pp. 809–812, or through an interdigitated strip Lange-type coupler, for example as described in "Interdigitated Strip-Line Quadrature Hybrid", Julius Lange, 1969 *International Microwave Symposium*, Dallas, Tex. May 5–7, IEEE Cat. No. 69 c 6, pp. 10–13.

When implemented as an up converter, LO and IF signals are each input at ports 26 and 28 to generate an output RF signal at port 24. In this latter implementation, an RF signal is induced on transmission line 24 from first conductor pair 6 and 8 and from second conductor pair 10 and 12 acting as primaries. In other applications, for both up and down converters, the RF and LO signals are transposed.

As is known in the art, conversion efficiency is degraded by various influences introducing distortion, loss, and the like. Some of these degrading influences include long lead lengths from the diodes (inducing stray capacitance), unequal lead lengths, and undesired coupling between the leads caused by non-orthogonal orientation therebetween. The present invention offers significant improvements substantially overcoming these degrading influences. The diode leads are extremely short and have substantially the same length. The leads are oriented substantially orthogonally with respect to each other. The symmetric circuit layout and port structure affords substantially equal path lengths through the diodes.

In a desirable aspect of the invention, the circuit layout structure is fabricated using standard printed circuit board techniques. A simple off-the-shelf dielectric substrate which is copper clad on both sides is used. The copper is merely etched away to yield the conductor patterns shown.

In another advantageous aspect of the invention, the circuit layout and structure provides desirable microstrip transmission characteristics, as opposed to slotline and the like transmission characteristics and their attendant constraints. These constraints include various limitations on the dimensions of the slot, minimum ground plane spacing on either side of the slot, requisite high dielectric constant substrate, transmission mode waveguide problems, etc.

The present invention is implementable on low dielectric constant substrate material, for example in the range of 2 to 5. While a high dielectric constant substrate may of course be used, the use of a low dielectric constant substrate is preferred in order to reduce cost.

The preferred dimensions of the conductor widths and gap widths are easily and cost efficiently implementable with standard printed circuit board techniques. For a typical 6 GHz mixer, the width of gap 14 is 72 mils. The width of bottomside conductor sections 26c and 28c and of stubs 16, 18, 20 and 22 is 60 mils. The combined length of stubs 16 and 20 and of the gap between conductors 6 and 10 is 781 mils. The combined length of first conductor pair 6 and 8 and of gap 14 is 685 mils. The width of transmission line 24 is 108 mils. The width of conductors 6, 8, 10 and 12 is 36 mils. The gap width between conductors 6 and 10 and between 8 and 12 is 36 mils. The dimension between conductor ends 26d and 28d is 168 mils. Substrate 2 has a dielectric constant of 2.17 and a thickness of 15 mils.

Though not a constraint of the invention, the above noted parameters are significant, particularly the gap width and dielectric constant. The present invention affords relatively large dimensions which are easy to implement and cost efficient in manufacture.

The circuit layout provides mutual isolation between the RF, LO and IF signals. The LO signal on conductor 26 is isolated from conductor 28, and vice versa, by the separation of mixer sections 34 and 36.

The RF signal on balanced junction points 38 and 40 due to the induced RF field between conductors 6 and 8 across gap 14 is isolated from conductor 26. The RF signal from junction point 38 flows through diode D1 and then diode D2 to junction point 40. Since RF conductor points 38 and 40 are balanced, they are each other's reference points, and hence the voltage on junction point 38 is referenced to junction point 40, not to ground. The RF signal from junction point 38 flows through diode D1 toward point 42a and then away from point 42a through diode D2. Conductor point 42 thus sees opposite polarities (voltages which are 180° out of phase), and hence no new or additional net voltage is induced on conductor point 42 from the RF signal between conductor points 38 and 40. The RF signal between balanced points 44 and 46 is likewise isolated from conductor 28 and point 48.

The LO signals on conductors 26 and 28 are isolated from the RF signals between points 38 and 40 and points 44 and 46. The LO signal on point 42 sees an effective ground at each of points 38 and 40, due to the grounding stubs 16 and 18 whereby to add the same effective voltage to each in parallel, resulting in no change of the net voltage difference between points 38 and 40. The LO signal on bottomside conductor section 26c sees equal reference levels at points 38 and 40 due to stubs 16 and 18 between which bottomside conductor section 26c extends in closely spaced parallel relation. The LO signal on point 48 is likewise isolated from the RF signal between points 44 and 46.

It is recognized that various modifications are possible within the scope of the appended claims.

I claim:

1. Balun coupled microwave circuit layout and structure comprising:
   a dielectric substrate;
   ground plane means on a bottomside of said substrate;
   a first balun secondary conductor pair having first and second conductors and a second balun secondary conductor pair having third and fourth conductors, each conductor pair being on the bottomside of said substrate with the respective conductors of each of said first and second pairs extending from said ground plane means towards each other and terminating in respective spaced ends facing each other at a separation gap therebetween;
   a transmission line on the topside of said substrate juxtaposed said first and second pairs of secondary conductors for interacting therewith to dual balun couple a field balanced between the first secondary conductor pair across said gap and a field balanced between the second secondary conductor pair across said gap;
   fifth and sixth conductors having topside coplanar sections on the topside of said substrate and having respective linking sections extending down through said substrate to respective bottomside coplanar sections on the bottomside of said substrate, said bottomside sections having spaced ends proximate the spaced ends of said first and second pairs of secondary conductors and said bottomside sections extending oppositely away therefrom; and
   a diode mixer having first and second separate, isolated sections, said first section comprising a first diode pair interconnecting the first and second conductors of said first secondary conductor pair and the bottomside section of said fifth conductor at coplanar connection points on the bottomside of said substrate for heterodyne modulation product signal generation, said second section comprising a second diode pair interconnecting the third and fourth conductors of said second secondary conductor pair and the bottomside section of said sixth conductor at coplanar connection points on the bottomside of said substrate for heterodyne modulation product signal generation.

2. The invention according to claim 1 wherein:
   said first diode pair is connected in series between said first secondary conductor pair;
   said bottomside section of said fifth conductor is connected to a point between said first diode pair;
   said second diode pair is connected in series between said second secondary conductor pair; and
   said bottomside section of said sixth conductor is connected to a point between said second diode pair.

3. The invention according to claim 2 wherein each said diode pair has three coplanar substantially equal length orthogonal leads.

4. The invention according to claim 1 wherein the first and third conductors extend in spaced parallel relation from said ground plane means and respectively, collinearly with the second fourth conductors which extend in spaced parallel relation from an opposite portion of said ground plane means.

5. The invention according to claim 4 wherein:
   said transmission line extends in spaced parallel relation over said first and second pairs of secondary conductors and is orthogonal to and coplanar with said topside sections of said fifth and sixth conductors; and
   said bottomside sections of said fifth and sixth conductors are collinear and extend orthogonally to said first and second pairs of secondary conductors, the spaced ends of said bottomside sections being separated by said separation gap.

6. The invention according to claim 1 further comprising means setting the connection points on said first secondary conductor pair at substantially the same potential reference level relative to signals on said bottomside section of said fifth conductor such that no net potential is induced between said first secondary conductor pair from said bottomside section of said fifth conductor such that signals on said fifth conductor are isolated from said first secondary conductor pair, and setting the connection points on said second secondary conductor pair at substantially the same potential reference level relative to signals on said bottomside section of said sixth conductor such that no net potential is induced between said second secondary conductor pair from said bottomside section of said sixth conductor such that signals on said bottomside section of said sixth conductor are isolated from said second secondary conductor pair.

7. The invention according to claim 6 wherein signals on said fifth conductor are isolated from said sixth conductor by the separation of said mixer sections.

8. The invention according to claim 7 wherein said last mentioned means comprises stub means extending from said first and second pairs of secondary conductors to said ground plane means.

9. The invention according to claim 8 wherein each secondary conductor of said pairs has a stub diverging therefrom to said ground plane means.

10. The invention according to claim 9 wherein the stubs diverging from said first secondary conductor pair extend to said ground plane means in spaced parallel relation, and the stubs diverging from said second secondary conductor pair also extend to said ground plane means in spaced parallel relation but oppositely from said first mentioned stubs.

11. The invention according to claim 10 wherein said bottomside section of said fifth conductor extends in spaced parallel coplanar relation between said stubs diverging from said first secondary conductor pair, and wherein said bottomside section of said sixth conductor extends in spaced parallel coplanar relation between said stubs diverging from said second secondary conductor pair.

* * * * *